US011322215B1

(12) United States Patent
Tsao et al.

(10) Patent No.: US 11,322,215 B1
(45) Date of Patent: May 3, 2022

(54) ONE-TIME PROGRAMMABLE MEMORY DEVICE

(71) Applicant: UNITED MICROELECTRONICS CORP., Hsin-Chu (TW)

(72) Inventors: Pin Tsao, Tainan (TW); Tsung-Hsun Wu, Kaohsiung (TW); Liang-Wei Chiu, Tainan (TW); Kuo-Hsing Lee, Hsinchu County (TW); Sheng-Yuan Hsueh, Tainan (TW); Kun-Hsien Lee, Tainan (TW); Chang-Chien Wong, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/326,375

(22) Filed: May 21, 2021

(30) Foreign Application Priority Data

Apr. 23, 2021 (CN) ......................... 202110440988.3

(51) Int. Cl.
*G11C 17/14* (2006.01)
*G11C 17/16* (2006.01)
*G11C 17/18* (2006.01)

(52) U.S. Cl.
CPC ............ *G11C 17/146* (2013.01); *G11C 17/14* (2013.01); *G11C 17/16* (2013.01); *G11C 17/18* (2013.01)

(58) Field of Classification Search
CPC ....... G11C 17/146; G11C 17/14; G11C 17/16; G11C 17/18
See application file for complete search history.

(56) References Cited

U.S. PATENT DOCUMENTS 9,589,970 B1 3/2017 Tseng et al.
9,613,714 B1 4/2017 Wong et al.
2008/0283931 A1* 11/2008 Wada .................... G11C 17/16 257/E27.102
2009/0027942 A1* 1/2009 Chen .................... H01L 27/115 365/104
2016/0300622 A1 10/2016 Hsu

* cited by examiner

*Primary Examiner* — Han Yang
(74) *Attorney, Agent, or Firm* — Winston Hsu

(57) ABSTRACT

A one-time programmable (OTP) memory device includes a first memory cell, which further includes a first source line extending along a first direction on a substrate, a first word line extending along the first direction on one side of the first source line, a second word line extending along the first direction on another side of the first source line, a first diffusion region extending along a second direction adjacent to two sides of the first word line and the second word line, and a first metal interconnection connecting the first word line and the second word line.

16 Claims, 1 Drawing Sheet

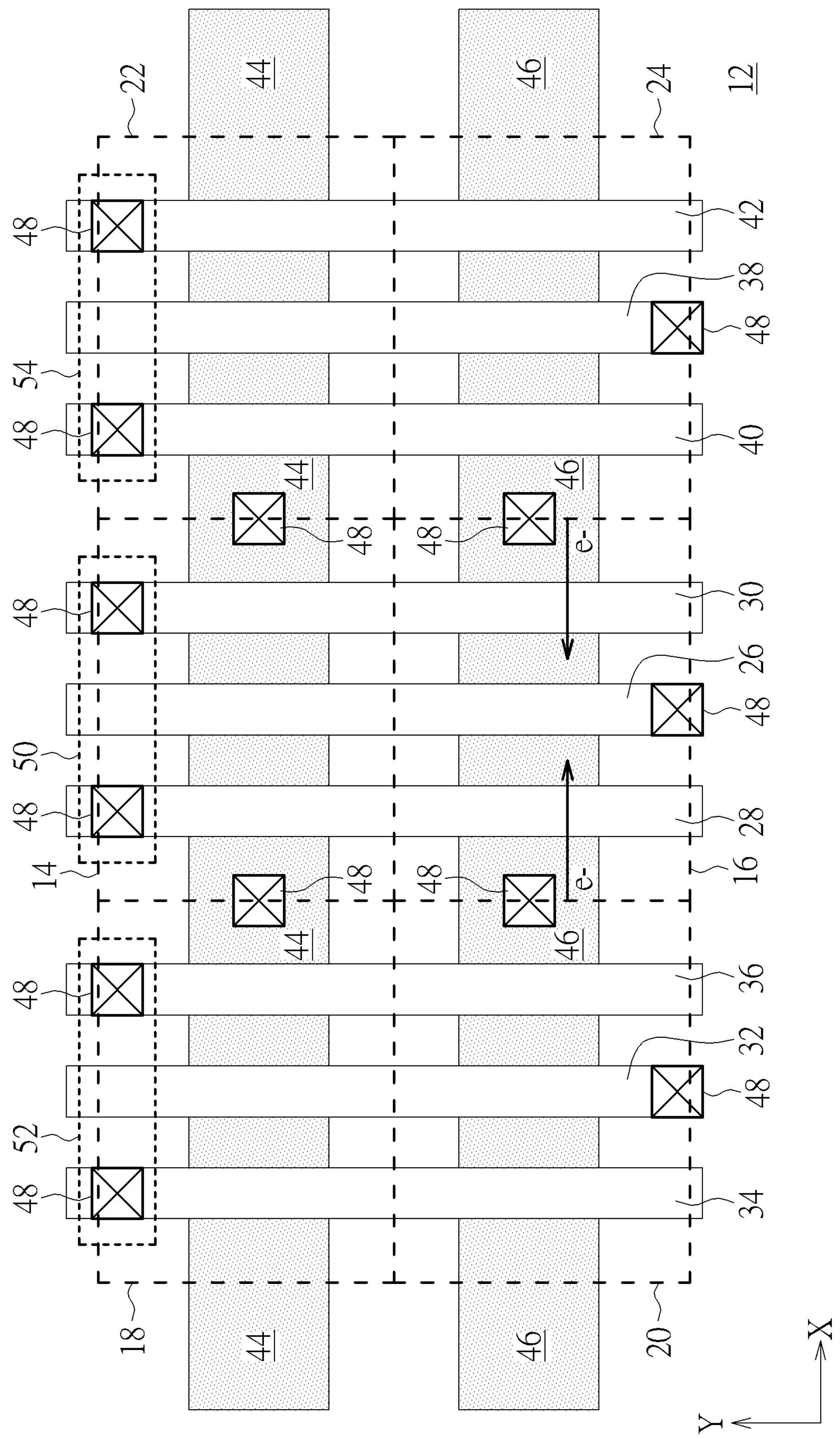
12
22
24
44
46
48
42
38
54
40
30
26
50
28
14
16
36
32
52
34
18
20
e-
X
Y

ONE-TIME PROGRAMMABLE MEMORY DEVICE

BACKGROUND OF THE INVENTION

1. Field of the Invention

The invention relates to a non-volatile memory device, and more particularly to a one-time programmable memory device.

2. Description of the Prior Art

Semiconductor memory devices including non-volatile memory devices have been widely used in various electronic devices such as cellular phones, digital cameras, personal digital assistants (PDAs), and other applications. Typically, non-volatile memory devices include multi-time programmable (MTP) memory devices and one-time programmable (OTP) memory devices. In contrast to rewritable memories, OTP memory devices have the advantage of low fabrication cost and easy storage. However, OTP memory devices could only perform a single data recording action such that when certain memory cells of a destined storage block were stored with a writing program, those memory cells could not be written again.

Since current OTP memory devices still have the disadvantage of weak reading current and longer stress time under program mode, how to improve the current architecture for OTP memory devices has become an important task in this field.

SUMMARY OF THE INVENTION

According to an embodiment of the present invention, an one-time programmable (OTP) memory device includes a first memory cell, which further includes a first source line extending along a first direction on a substrate, a first word line extending along the first direction on one side of the first source line, a second word line extending along the first direction on another side of the first source line, a first diffusion region extending along a second direction adjacent to two sides of the first word line and the second word line, and a first metal interconnection connecting the first word line and the second word line.

These and other objectives of the present invention will no doubt become obvious to those of ordinary skill in the art after reading the following detailed description of the preferred embodiment that is illustrated in the various FIGURES and drawings.

BRIEF DESCRIPTION OF THE DRAWINGS

FIGURE illustrates a layout pattern of an OTP memory device according to an embodiment of the present invention.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Referring to the FIGURE, the FIGURE illustrates a layout pattern of an OTP memory device according to an embodiment of the present invention. As shown in the FIGURE, a substrate 12 made of semiconductor material is provided, in which the substrate 12 could be selected from the group consisting of silicon (Si), germanium (Ge), Si—Ge compounds, silicon carbide (SiC), and gallium arsenide (GaAs). Next, six memory cells or cell regions such as memory cells 14, 16, 18, 20, 22, 24 are defined on the substrate 12, in which each of the memory cells include at least a source line, two word lines disposed adjacent to two sides of the source line, and diffusion regions disposed between the source line and the word lines.

Preferably, the substrate 12 includes a source line 26 extending along a first direction such as Y-direction on the substrate 12, a word line 28 extending along the Y-direction on one side of the source line 26, a word line 30 extending along the Y-direction on another side of the source line 26, a source line 32 extending along the Y-direction adjacent to one side of the word line 28, a word line 34 extending along the Y-direction on one side of the source line 32, a word line 36 extending along the Y-direction on another side of the source line 32, a source line 38 extending along the Y-direction adjacent to one side of the word line 30, a word line 40 extending along the Y-direction on one side of the source line 38, a word line 42 extending along the Y-direction on another side of the source line 38, diffusion regions 44 extending along a second direction such as X-direction adjacent to two sides of the source line 26, word lines 28, 30, source line 32, word lines 34, 36, source line 38, word lines 40, 42, diffusion regions 46 extending along the X-direction adjacent to two sides of the source line 26, word lines 28, 30, source line 32, word lines 34, 36, source line 38, word lines 40, 42, contact plugs 48 disposed on the diffusion regions 44, 46, the source lines 26, 32, 38, and the word lines 28, 30, 34, 36, 38, 40, and metal interconnections 50, 52, 54 connecting the contact plugs 48. In this embodiment, the contact plugs 48 disposed directly on the diffusion regions 44, 46 are also referred to as bit line contacts.

Preferably, the memory cell 14 on the center top portion includes the aforementioned source line 26, word lines 28, 30 adjacent to two sides of the source line 26, diffusion region 44 disposed adjacent to two sides of the source line 26 and two sides of the word lines 28, 30, contact plugs 48 disposed on the diffusion region 44 adjacent to two sides of the word lines 28, 30 and directly on the word lines 28, 30, and metal interconnection 50 connecting the contact plugs 48, in which the metal interconnection 50 is preferably the first level metal interconnection disposed on top of the contact plugs 48 and the metal interconnection 50 preferably connect the two word lines 28, 30 by directly contacting the contact plugs 48 on the word lines 28, 30. The memory cell 16 below the memory cell 14 on the other hand includes the source line 26, word lines 28, 30 adjacent to two sides of the source line 26, diffusion region 46 disposed adjacent to two sides of the source line 26 and two sides of the word lines 28, 30, and contact plugs 48 disposed on the diffusion region 46 adjacent to two sides of the word lines 28, 30 and directly on the word lines 28, 30.

The memory cell 18 on the left top portion includes the aforementioned source line 32, word lines 34, 36 adjacent to two sides of the source line 32, diffusion region 44 disposed adjacent to two sides of the source line 32 and two sides of the word lines 34, 36, contact plugs 48 disposed directly on the word lines 34, 36, and metal interconnection 52 connecting the word lines 34, 36 through the contact plugs 48. The memory cell 20 below the memory cell 18 on the other hand includes the source line 32, word lines 34, 36 adjacent to two sides of the source line 32, diffusion region 46 disposed adjacent to two sides of the source line 32 and two sides of the word lines 34, 36, and a contact plug 48 disposed directly on the word line 32.

Similar to the memory cells 18, 20, the memory cells 22, 24 on the right also include similar arrangement. For instance, the memory cell 22 on the right top portion includes the aforementioned source line 38, word lines 40, 42 adjacent to two sides of the source line 38, diffusion region 44 disposed adjacent to two sides of the source line 38 and two sides of the word lines 40, 42, contact plugs 48 disposed directly on the word lines 40, 42, and metal interconnection 52 connecting the word lines 40, 42 through the contact plugs 48. The memory cell 24 below the memory cell 22 on the other hand includes the source line 38, word lines 40, 42 adjacent to two sides of the source line 38, diffusion region 46 disposed adjacent to two sides of the source line 38 and two sides of the word lines 40, 42, and a contact plug 48 disposed directly on the word line 38. It should be noted that even though the OTP memory device of this embodiment only includes six memory cells, according to other embodiment of the invention it would also be desirable to increase or decrease the number of memory cells by following the aforementioned cell arrangement, which is also within the scope of the present invention.

In this embodiment, each of the source lines 26, 32, 38 and word lines 28, 30, 34, 36, 40, 42 include a gate structure and spacer (not shown) around the gate structure while the diffusion regions 44, 46 adjacent to two sides of the source lines 26, 32, 38 and word lines 28, 30, 34, 36, 40, 42 are in fact source/drain regions. Preferably, each of the gate structures could be a polysilicon gate or metal gate and each of the gate structures could be accomplished by a gate first process, a high-k first process from a gate last process, or a high-k last process from the gate last process. In this embodiment, each of the gate structures such as metal gates could include elements such as but not limited to for example interfacial layer, high-k dielectric layer, work function metal layer, and low-resistance metal layer.

Preferably, the high-k dielectric layer is selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the metal gate in accordance with the conductivity of the device. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof. Since the fabrication of metal gate is well known to those skilled in the art, the details of which are not explained herein for the sake of brevity.

Overall, the present invention discloses a layout for OTP memory device, which preferably places two word lines immediately adjacent to a single source line for reducing the overall area of the layout pattern. For instance, the source line shown in the FIGURE, word lines 28, 30 are disposed immediately adjacent to two sides of the source line 26 while word lines 36 40 are also disposed immediately adjacent to the word lines 28, 30. In other words, the edge of the diffusion region 44 or 46 between the word lines 28, 36 for example preferably contacts the edge of the word lines 28, 36 directly so that no element such as shallow trench isolation (STI) is disposed between the diffusion regions 44, 46 and the word lines 28, 36. Similarly, the edge of the diffusion region 44 or 46 between the word lines 30, 40 also contacts the edge of the word lines 30, 40 directly so that no STI is disposed between the diffusion regions 44, 46 and the word lines 30, 40.

By using the aforementioned layout arrangement, the distance or edge of each of the memory cells extending along the X-direction could be reduced by 0.93 times compare to conventional art and the distance of each of the memory cells extending along the Y-direction could be enlarged by 1.05 times compare to conventional art and consequently, the overall area of each of the memory cells of the present invention could be reduced by approximately 3%. Moreover, since electrons are transmitted along the direction of the arrow as shown in the FIGURE from the word lines 28, 30 on adjacent two sides toward the source line 26 in the middle, it would be desirable to reduce programmable time while maintaining Vpp voltage or reduce Vpp voltage and increase read current at least two times or more while maintaining programmable time according to the aforementioned layout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An one-time programmable (OTP) memory device, comprising:
  - a first memory cell comprising:
    - a first source line extending along a first direction on a substrate;
    - a first word line extending along the first direction on one side of the first source line;
    - a second word line extending along the first direction on another side of the first source line;
    - a first diffusion region extending along a second direction adjacent to two sides of the first word line and the second word line; and a first metal interconnection connecting the first word line and the second word line.

2. The OTP memory device of claim 1, wherein the first diffusion region is disposed between the first word line and the first source line.

3. The OTP memory device of claim 1, wherein the first diffusion region is disposed between the first source line and the second word line.

4. The OTP memory device of claim 1, wherein the first memory cell further comprises a first bit line contact disposed on the first diffusion region adjacent to one side of the first word line.

5. The OTP memory device of claim 1, wherein the first memory cell further comprises a second bit line contact disposed on the first diffusion region adjacent to one side of the second word line.

6. The OTP memory device of claim 1, further comprising a second memory cell, the second memory cell comprising:

the first source line extending along the first direction;

the first word line extending along the first direction on one side of the first source line;

the second word line extending along the first direction on another side of the first source line; and a second diffusion region extending along the second direction adjacent to two sides of the first word line and the second word line.

7. The OTP memory device of claim 6, wherein the second diffusion region is disposed between the first word line and the first source line.

8. The OTP memory device of claim 6, wherein the second diffusion region is disposed between the first source line and the second word line.

9. The OTP memory device of claim 6, wherein the second memory cell further comprises a third bit line contact disposed on the second diffusion region adjacent to one side of the first word line.

10. The OTP memory device of claim 1, wherein the second memory cell further comprises a fourth bit line contact disposed on the second diffusion region adjacent to one side of the second word line.

11. The OTP memory device of claim 6, further comprising a third memory cell, the third memory cell comprising:

a second source line extending along the first direction on one side of the first word line;

a third word line extending along the first direction on one side of the second source line;

a fourth word line extending along the first direction on another side of the second source line;

the first diffusion region extending along the second direction adjacent to two sides of the third word line and the fourth word line; and a second metal interconnection connecting the third word line and the fourth word line.

12. The OTP memory device of claim 11, wherein the first diffusion region is disposed between the third word line and the second source line.

13. The OTP memory device of claim 11, wherein the first diffusion region is disposed between the second source line and the fourth word line.

14. The OTP memory device of claim 11, further comprising a fourth memory cell, the fourth memory cell comprising:

the second source line extending along the first direction on one side of the first word line;

the third word line extending along the first direction on one side of the second source line;

the fourth word line extending along the first direction on another side of the second source line; and the second diffusion region extending along the second direction adjacent to two sides of the third word line and the fourth word line.

15. The OTP memory device of claim 14, wherein the second diffusion region is disposed between the third word line and the second source line.

16. The OTP memory device of claim 14, wherein the second diffusion region is disposed between the second source line and the fourth word line.

* * * * *